United States Patent
Chang et al.

(10) Patent No.: US 7,271,661 B2
(45) Date of Patent: Sep. 18, 2007

(54) OPERATION AMPLIFIER CIRCUIT HAVING DIGITAL DRIVING CIRCUITRY AND ANALOG DRIVING CIRCUITRY

(75) Inventors: Yu-Jui Chang, Tainan Hsien (TW); Ying-Lieh Chen, Tainan County (TW)

(73) Assignee: Himax Technologies Limited, Sinshih Township, Tainan County (TW)

(*) Notice: Subject to any disclaimer, the term of this patent is extended or adjusted under 35 U.S.C. 154(b) by 207 days.

(21) Appl. No.: 10/908,989

(22) Filed: Jun. 3, 2005

(65) Prior Publication Data
US 2006/0273856 A1    Dec. 7, 2006

(51) Int. Cl.
H03F 3/68 (2006.01)
H03F 3/217 (2006.01)

(52) U.S. Cl. .................... 330/295; 330/251
(58) Field of Classification Search ............. 330/251, 330/295
See application file for complete search history.

(56) References Cited

U.S. PATENT DOCUMENTS 4,390,846 A * 6/1983 Cragfors et al. ........... 330/10
5,783,956 A * 7/1998 Ooishi ..................... 327/157
6,710,617 B2   3/2004 Humphrey ................ 326/30

FOREIGN PATENT DOCUMENTS

TW        509886        11/2002

* cited by examiner

Primary Examiner—Steven J. Mottola
(74) Attorney, Agent, or Firm—Winston Hsu

(57) ABSTRACT

An operational amplifier circuit includes an analog driving circuitry and a digital driving circuitry. The analog driving circuitry is coupled to a load and drives the load according to an input signal. The digital driving circuitry includes a code comparator, a sourcing unit, and a sinking unit. The code comparator compares a reference code with codes corresponding to the input signal and generates a first control signal and a second control signal accordingly. The sourcing unit is coupled to the code comparator and the load, and sources a first current to the load according to the first control signal. The sinking unit is coupled to the code comparator and the load, and sinks a second current from the load according to the second control signal.

6 Claims, 2 Drawing Sheets

OPERATION AMPLIFIER CIRCUIT HAVING DIGITAL DRIVING CIRCUITRY AND ANALOG DRIVING CIRCUITRY

BACKGROUND OF INVENTION

1. Field of the Invention

The present invention relates to an operational amplifier (op amp), and more particularly, to an operation amplifier circuit having a digital driving circuitry and an analog driving circuitry.

2. Description of the Prior Art

The operational amplifier (op amp) is an essential circuit building block of universal importance. A reason for the popularity of the op amp is its versatility; a great amount of operations can be done with op amps. Normally, an operational amplifier circuit is used to drive a load according to an analog input signal. However, if a digital input signal is adopted, a digital-to-analog converter (DAC) must be set in the signal input end of the operational amplifier circuit to convert the digital input signal into an analog input signal. The operational amplifier circuit can then drive the load according to the analog input signal.

For instance, the liquid crystal display (LCD) source driver is a kind of device that needs to utilize an operational amplifier circuit including a DAC to drive a LCD display unit according to a digital input signal. FIG. 1 shows a schematic diagram of a conventional operational amplifier circuit 100 utilized in a LCD source driver. The LCD display unit driven by the operational amplifier circuit 100 is represented by a block "load 190" in FIG. 1. The operational amplifier circuit 100 shown in FIG. 1 includes a DAC 110 and an op amp 120. The DAC 110 converts a digital input signal $S_{IN}$ into an analog input signal $S'_{IN}$. The op amp 120 then drives the load 190 according to the analog input signal $S'_{IN}$.

The op amp 120 can be thought of as an analog driving circuitry of the conventional operational amplifier circuit 100, and is fully responsible for driving the load 190. To make sure that the op amp 120 is qualified for driving the load 190 swiftly, sizes of circuit components (such as transistors) of the op amp 120 should be large enough, and bias currents utilized by the op amp 120 cannot be too small. Therefore, some integrated circuit (IC) area is wasted, and some power is consumed unnecessarily.

SUMMARY OF INVENTION

It is an objective of the claimed invention to provide an operational amplifier circuit having a digital driving circuitry and an analog driving circuitry.

According to the claimed invention, an operational amplifier circuit is disclosed. The operational amplifier circuit includes an analog driving circuitry and a digital driving circuitry. The analog driving circuitry is coupled to a load and drives the load according to an input signal. The digital driving circuitry includes a code comparator, a sourcing unit, and a sinking unit. The code comparator compares a reference code with codes corresponding to the input signal and generates a first control signal and a second control signal accordingly. The sourcing unit is coupled to the code comparator and the load, and sources a first current to the load according to the first control signal. The sinking unit is coupled to the code comparator and the load, and sinks a second current from the load according to the second control signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
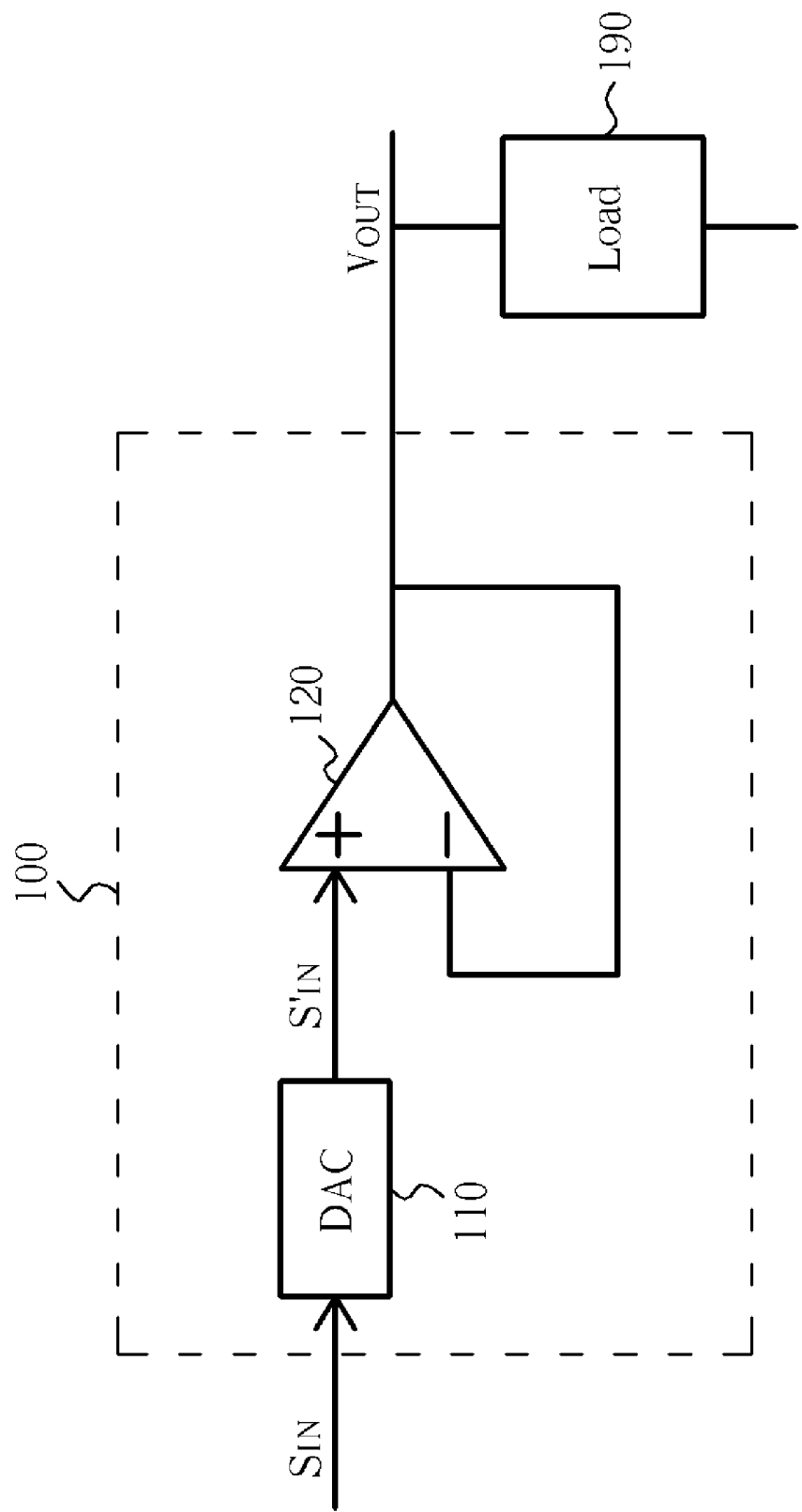
FIG. 1 shows a schematic diagram of a conventional operational amplifier circuit.
Figure 2:
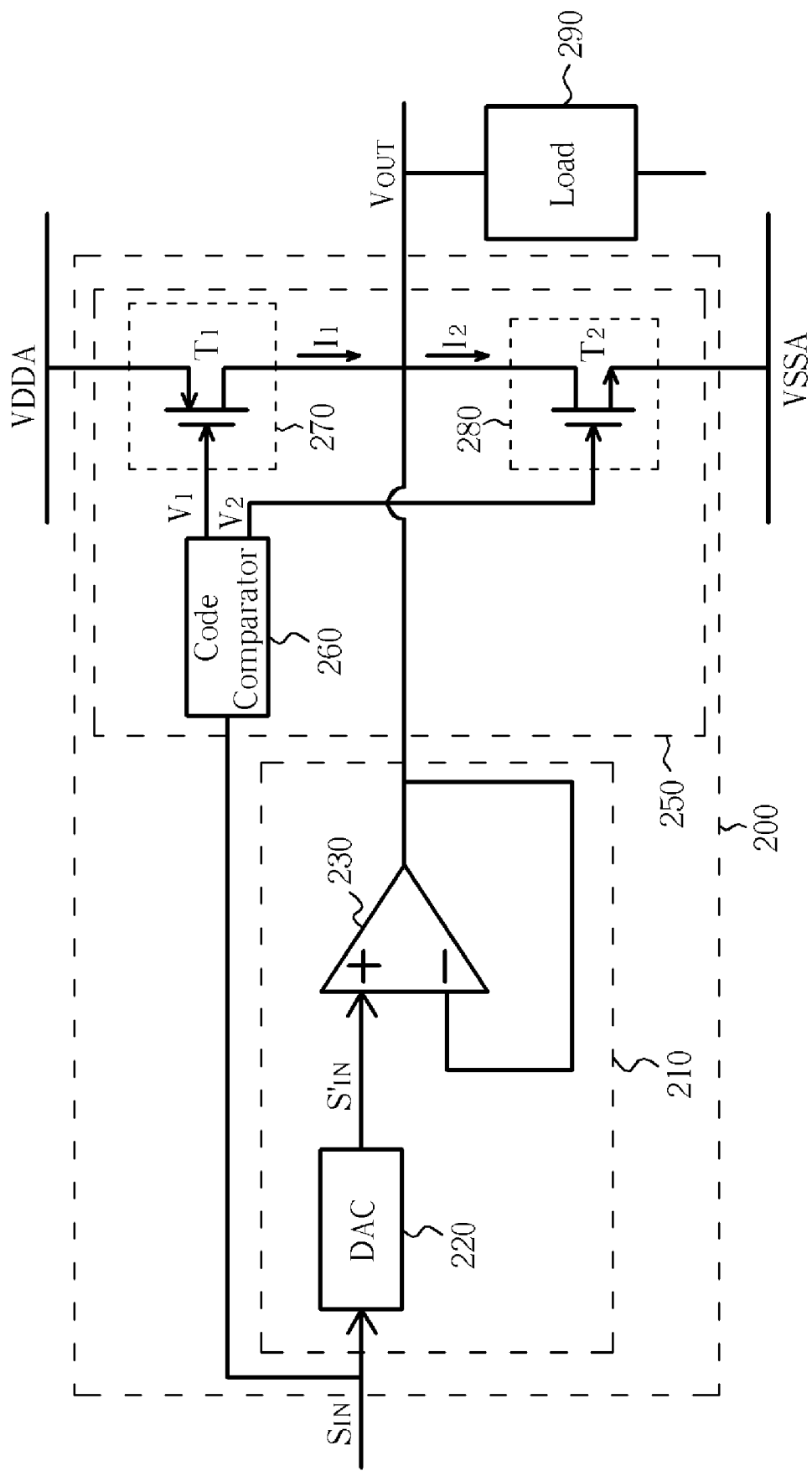
FIG. 2 shows a schematic diagram of an operational amplifier circuit according to the present invention.

FIG. 2 shows a schematic diagram of an operational amplifier circuit 200 according to an embodiment of the present invention. In this embodiment, the operational amplifier circuit 200 is set inside a LCD source driver for driving a LCD display unit according to a digital input signal $S_{IN}$. The LCD display unit driven by the LCD source driver is represent by a block "load 290" in FIG. 2. In other embodiments, however, the operational amplifier circuit of the present invention can also be set in other kind of device for driving a load according to a digital input signal or an analog input signal.

The operational amplifier circuit 200 of this embodiment comprises an analog driving circuitry 210 and a digital driving circuitry 250. The analog driving circuitry 210 is for driving the load 290 in an analog manner. The analog driving circuitry 210 in this embodiment includes a DAC 220 and an op amp 230. With these two components, an output voltage $V_{OUT}$ of the operational amplifier circuit 200 is controlled according to the input signal $S_{IN}$.

The digital driving circuitry 250 is for driving the load 290 in a digital manner. The digital driving circuitry 250 includes a code comparator 260, a sourcing unit 270 (which includes a first transistor $T_1$ in this embodiment), and a sinking unit 280 (which includes a second transistor $T_2$ in this embodiment). The code comparator 260 compares a reference code with codes of the input signal $S_{IN}$ to generate a first control signal $V_1$ and a second control signal $V_2$ accordingly. More particularly, by comparing the reference code with codes of the input signal $S_{IN}$, the code comparator 260 can determine when the output voltage $V_{OUT}$ should be raised and when the output voltage $V_{OUT}$ should be abated. When it is determined that the output voltage $V_{OUT}$ should be raised, the code comparator 260 utilizes the first control signal $V_1$ to turn the first transistor $T_1$ on for a short period to source a first current $I_1$ to the load 290. When it is determined that the output voltage $V_{OUT}$ should be abated, the code comparator 260 utilizes the second control signal $V_2$ to turn the second transistor $T_2$ on for a short period to sink a second current I2 from the load 290.

Preferably, the analog driving circuitry 210 is utilized to fine-drive the output voltage $V_{OUT}$, and the digital driving circuitry 250 is utilized to coarse-drive the output voltage $V_{OUT}$. The definitions on the terms "fine drive" and "coarse drive" can be determined by the system designer. For example, when a code of the digital input signal $S_{IN}$ is received by the operational amplifier circuit 200 and the output voltage $V_{OUT}$ should be raised to 3V according to the code, the digital driving circuitry 250 can be utilized first to coarsely raise the output voltage $V_{OUT}$ to a level between 2.8V~3.2V. Then, the analog driving circuitry 210 can be utilized to finely adjust the output voltage $V_{OUT}$ to exactly 3V. When a next code of the digital input signal $S_{IN}$ is received by the operational amplifier circuit 200 and the output voltage $V_{OUT}$ should be abated to 0V according to the next code, the digital driving circuitry 250 can be first utilized to coarsely abate the output voltage $V_{OUT}$ to a level between −0.2V~+0.2V. Then the analog driving circuitry 210 can be utilized to finely adjust the output voltage $V_{OUT}$ to exactly 0V.

Since the digital driving circuitry 250 belongs to static logic, constant bias current is not required by the digital driving circuitry 250. Only when the load 290 needs to be coarsely driven, power is consumed by the digital driving circuitry 250; unnecessary power consumption is therefore reduced. Since the analog driving circuitry 210 is just used for fine-driving the output voltage $V_{OUT}$, circuit components (such as transistors) of the op amp 230 can have small sizes, and small bias currents will be enough for the op amp 230.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier circuit comprising:
   an analog driving circuitry coupled to a load for driving the load according to an input signal; and
   a digital driving circuitry coupled to the load for driving the load according to the input signal;
   wherein the input signal is a digital input signal.

2. The operational amplifier circuit of claim 1, wherein the digital driving circuitry comprises:
   a code comparator for comparing a reference code with codes corresponding to the input signal and generating a first control signal and a second control signal accordingly;
   a sourcing unit coupled to the code comparator and the load, for sourcing a first current to the load according to the first control signal; and
   a sinking unit coupled to the code comparator and the load, for sinking a second current from the load according to the second control signal.

3. The operational amplifier circuit of claim 2, wherein the sourcing unit comprises a first transistor having a gate coupled to the code comparator for receiving the first control signal, a source coupled to a high bias voltage, and a drain coupled to the load for sourcing the first current to the load; and the sinking unit comprises a second transistor having a gate coupled to the code comparator for receiving the second control signal, a source coupled to a low bias voltage, and a drain coupled to the load for sinking the second current from the load.

4. The operational amplifier circuit of claim 1, wherein the analog driving circuitry comprises:
   a digital to analog converter (DAC) for converting the digital input signal into an analog input signal; and
   an op amp coupled to the DAC and the load for driving the load according to the analog input signal received from the DAC.

5. The operational amplifier circuit of claim 1, wherein the operational amplifier circuit is set inside a liquid crystal display (LCD) source driver for driving the load according to the input signal, and the load is a LCD display unit.

6. An operational amplifier circuit comprising:
   an analog driving circuitry coupled to a load for driving the load according to an input signal; and
   a digital driving circuitry coupled to the load for driving the load according to the input signal;
   wherein the operational amplifier circuit is set inside a liquid crystal display (LCD) source driver for driving the load according to the input signal, and the load is a LCD display unit.

* * * * *